United States Patent [19]
Ali et al.

[11] Patent Number: 5,849,396
[45] Date of Patent: Dec. 15, 1998

[54] MULTILAYER ELECTRONIC STRUCTURE AND ITS PREPARATION

[75] Inventors: Mir Akbar Ali, Lomita; Carl W. Peterson, Carson; Harry C. Jones, Cerritos, all of Calif.

[73] Assignee: Hughes Electronics Corporation, Los Angeles, Calif.

[21] Appl. No.: 527,665

[22] Filed: Sep. 13, 1995

[51] Int. Cl.$^6$ .............................. B32B 3/00; B32B 18/00; B32B 15/08
[52] U.S. Cl. .................... 428/209; 428/325; 428/327; 428/337; 428/458; 428/473.5; 428/901
[58] Field of Search ..................... 428/323, 327, 428/337, 458, 901, 209, 325, 473.5

[56] References Cited

U.S. PATENT DOCUMENTS

| | | | |
|---|---|---|---|
| 3,189,978 | 6/1965 | Stetson | 29/155.5 |
| 3,518,756 | 7/1970 | Bennett et al. | 29/625 |
| 3,549,415 | 12/1970 | Capek et al. | 117/215 |
| 4,201,616 | 5/1980 | Chellis et al. | 428/901 |
| 4,281,038 | 7/1981 | Ambros et al. | 428/901 |
| 4,313,026 | 1/1982 | Yamada et al. | 174/68.5 |
| 4,738,890 | 4/1988 | Tohrin et al. | 428/901 |
| 4,764,413 | 8/1988 | Nukii et al. | 428/901 |
| 4,931,365 | 6/1990 | Inoue et al. | 428/901 |
| 4,996,097 | 2/1991 | Fischer | 428/901 |
| 5,133,840 | 7/1992 | Buchwalter et al. | 205/167 |
| 5,162,144 | 11/1992 | Brown et al. | 428/209 |
| 5,338,826 | 8/1994 | St. Clair et al. | 528/353 |
| 5,358,775 | 10/1994 | Horn, III | 428/901 |
| 5,368,921 | 11/1994 | Ishii et al. | 428/901 |
| 5,552,210 | 9/1996 | Horn, III et al. | 428/209 |
| 5,637,382 | 6/1997 | Kataoka et al. | 428/901 |

*Primary Examiner*—Bruce H. Hess
*Assistant Examiner*—Cathy F. Lam
*Attorney, Agent, or Firm*—Terje Gudmestad; Georgann S. Grunebach; Michael W. Sales

[57] ABSTRACT

An electronic structure is formed of alternating layers of a metal and a cured ceramic-polymer mixture. The ceramic-polymer mixture is prepared by mixing small ceramic particles into a flowable, curable polymer. The mixture is spread over a first metallic layer and, optionally, B-stage cured. Additional metallic layers and ceramic-polymer layers are added in alternating fashion. Metallic interconnects may be provided through overlying ceramic-polymer layers to a particular metallic layer. The resulting structure is heated to a moderate temperature to cure the polymer.

12 Claims, 3 Drawing Sheets

5,849,396

MULTILAYER ELECTRONIC STRUCTURE AND ITS PREPARATION

BACKGROUND OF THE INVENTION

This invention relates to the preparation of electronic structures having alternating layers of insulator and electrical conductor.

Many active electronic devices are based upon a generally planar architecture having alternating layers of active device elements and insulation. This approach allows the devices to be light in weight and thin even when large, complex circuits are used, yet readily fabricated due to the accessibility of the layers as they are formed. This generally planar architecture can also be used for passive devices such as microwave, analog, and digital distribution systems, wherein multiple metallic signal conducting layers are separated by insulator layers and metallic ground-plane layers to provide signal isolation.

In a known approach for fabricating such planar devices, a tape or thin sheet formed of ceramic particles mixed into a binder is prepared. Alternating layers of the tape and metallic sheets of the required configuration are stacked together and subjected to moderate heat and/or pressure to bind the elements of the stack together. The stack is then heated to a higher temperature in the range of 800°–1200° C. to sinter the ceramic particles together. This approach, while operable, has several disadvantages. The stack requires careful alignment of access openings during the stacking process to ensure registry of the elements in the final structure. The metallic components must withstand the high ceramic sintering temperature, requiring the use of expensive metals such as platinum or palladium which may not otherwise be optimal for the applications. The high processing temperatures can produce warpage in the final multilayer structure, resulting in low product yields in fabrication inasmuch as the warpage of the sintered ceramic article cannot be corrected.

An improved approach for producing layered electronic conductive structures is required. Such an approach should produce an operable stacked conductor structure with a high product yield. The present invention fulfills this need, and further provides related advantages.

SUMMARY OF THE INVENTION

The present invention provides a layered insulator/metallic electronic structure and a method for its fabrication, as well as materials useful in the insulator portion of the structure. The electronic structure is heated only to very moderate temperatures during fabrication, so that conventional conductor metals can be used. The conductive layers are readily patterned as necessary for a specific application. Through-thickness interconnect structures are built into the structure during fabrication. Consequently, structural registry and damage to through-thickness holes during fabrication do not pose problems. There is a high degree of process controllability, so that structures of selectable configuration and thickness can be readily prepared. Device production yields are high.

In accordance with the invention, a layered electronic structure comprises a first layer of a first-layer metal, and a second layer of a second-layer mixture of second-layer ceramic particles and a second-layer cured polymer. The second layer overlies, contacts, and is bonded to the first layer. The second layer ceramic particles are preferably barium titanate, titanium dioxide, ferrite, aluminum oxide, steatite, forsterite, or cordierite. The second-layer polymer material is preferably a difunctional bisphenol/epichlorohydrinderived epoxy or a polyimide.

In a related aspect of the invention, a method of fabricating a layered electronic structure comprises the steps of providing a metallic first layer, preparing a second-layer vacuum degassed mixture of second-layer ceramic particles and a second-layer curable polymer, forming a ceramic-polymer second layer of the vacuum degassed mixture over the metallic substrate so that the ceramic-polymer layer overlies and contacts the first metallic layer, and curing the curable polymer. The curing is typically accomplished at a temperature of no more than about 95°–180° C. for the preferred second-layer polymer materials. Curing is accompanied by little or no shrinkage of the insulator dimensions. By contrast, the sintering of ceramic-only insulator structures is accompanied by significant shrinkage which can lead to internal stresses and strains in the structure. The present approach virtually eliminates such internal stresses and strains The approach of the invention can be used to fabricate various types of layered electronic structures. A three-layer structure is fabricated as two metallic layers separated by a ceramic/polymer layer of controllable thickness. Multilayer microelectronic electrical distribution systems are prepared as alternating conductive and insulative layers. The conductive layers are patterned as necessary, and some layers can be made continuous and grounded to act as shielding ground planes. External connections to individual conductive layers are facilitated by through-thickness interconnects extending from a free surface to a selected conductive layer or between two conductive layers, which are built into the layered structure during its fabrication. A distribution system of this type can transmit conventional AC signals, DC signals, and microwave signals within a single thin structure, with the various signals carried on conductive layers that are shielded from each other by intermediate ground planes.

The present approach provides an advance in the art of multilayered electronic structures. A structure tailored to a specific requirement is fabricated in a manner which does not require heating to temperatures greater than about 180° C. in most cases. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
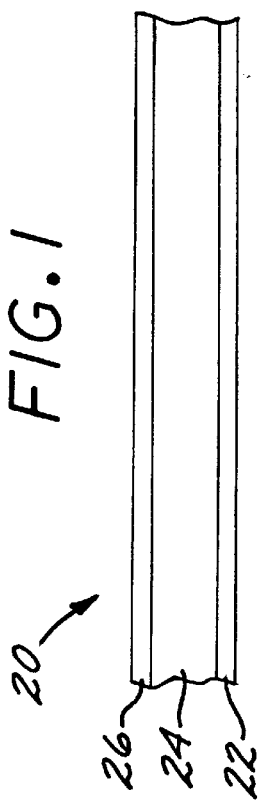
FIG. 1 is a fragmented side elevational view of a layered electronic structure made according to the invention.

FIG. 1 depicts a three-layered electronic structure 20 according to the invention, by way of example. (As with all figures herein, FIG. 1 is not drawn to scale.) The layered electronic structure 20 includes a first layer 22 of an electrically conducting first-layer metal. A second layer 24 of an electrically insulating second-layer mixture of second-layer ceramic particles and a second-layer cured polymer overlies, contacts, and is bonded to the first layer 22. A third layer 26 of a electrically conducting third-layer metal overlies, contacts, and is bonded to the second layer 24.

The first layer 22 and the third layer 26 are formed of an electrically conductive metal, such as, for example, aluminum, copper, Kovar™ metallic alloy, or Invar™ metallic alloy. (As used here, the naming of a metal includes the pure metal and its operable alloys.) The first layer 22 and the third layer 26 can be made of the same metal or different metals. The first layer 22 and the third layer can be provided as thin sheets to which the second layer 24 is bonded during fabrication, or the layers 22 and 24 can be deposited by other operable techniques such as vapor deposition or silk screening.

The second layer 24 is made of a mixture of second-layer ceramic particles and a second-layer cured polymer, sometimes termed herein a ceramic/polymer composite. The second-layer ceramic particles can be formed of any ceramic material, such as, for example, barium titanate, titanium dioxide, ferrite, aluminum oxide, steatite, forsterite, or cordierite, with barium titanate most preferred. The second-layer ceramic particles preferably are made of a ceramic material having a dielectric constant of from about 3 to about 98 for practical applications, but lower or higher dielectric constants are operable. The second-layer ceramic particles are preferably small in size, and most preferably on the order of from about 1 micrometer in maximum dimension to about 5 micrometers in maximum dimension.

The second-layer cured polymer can be any operable polymer formed by the polymerization and/or cross linking of a polymer precursor. Preferred polymer precursors include, for example, a difunctional bisphenol/epichlorohydrin-derived epoxy or a polyimide. Operable polyimide polymer and polymer precursors are discussed in Kirk-Othmer, "Encyclopedia of Chemical Technology", volume 18, pages 704–719 in the section entitled "Polyimides".

The second-layer ceramic particles preferably comprise from about 20 to about 75 percent by volume of the total mixture of second-layer ceramic particles and second-layer cured polymer. The relative proportions of ceramic and cured polymer determine in part the electrical properties of the ceramic/polymer composite layer, which can be selected by varying the proportions of the constituents and the thickness of the layer. This controllability is an important advantage of the invention, permitting the selection of the properties of the ceramic layer(s) by varying both the constituents and their relative proportions. The selection of the proportion of the constituents also permits minimizing of thermal mismatch between the layers by adjusting the coefficient of thermal expansion of the ceramic/polymer layer.

Figure 2:
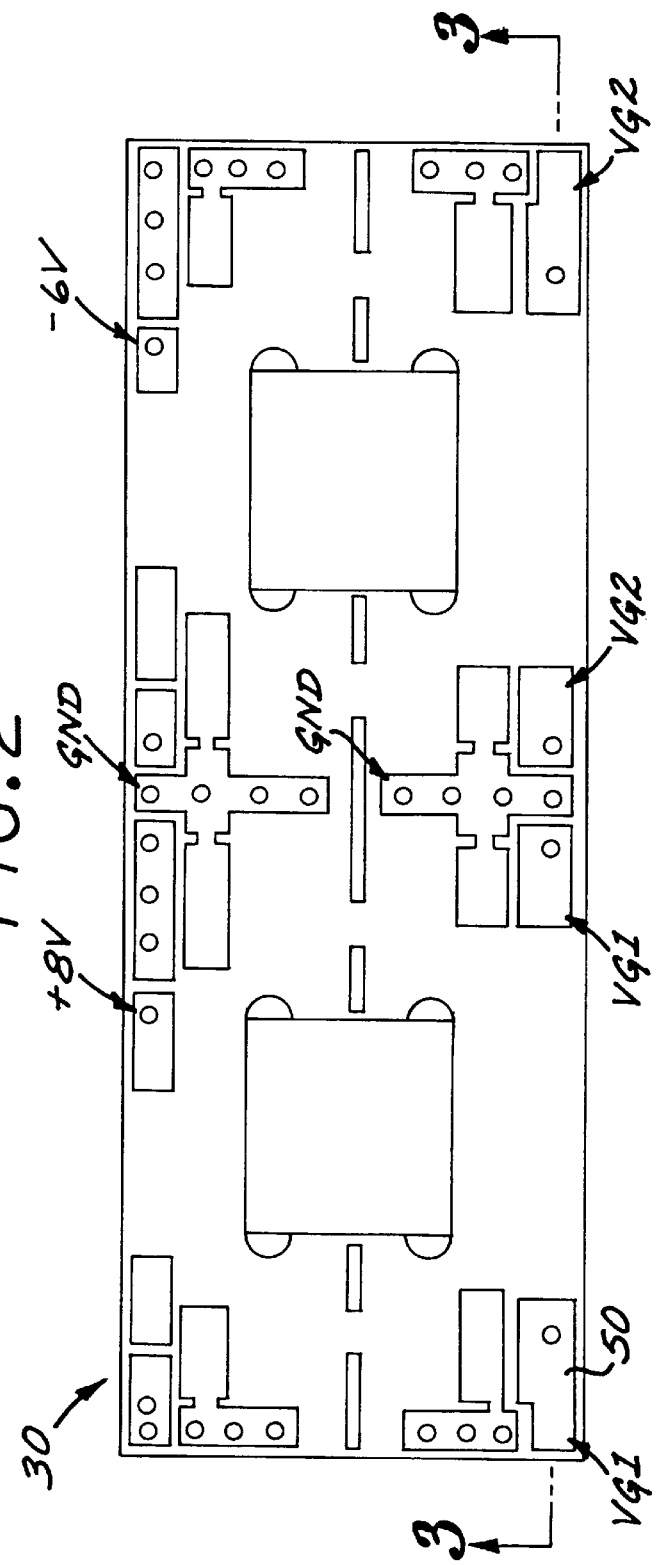
FIG. 2 is a schematic plan view of a multilayer electrical distribution system.
Figure 3:
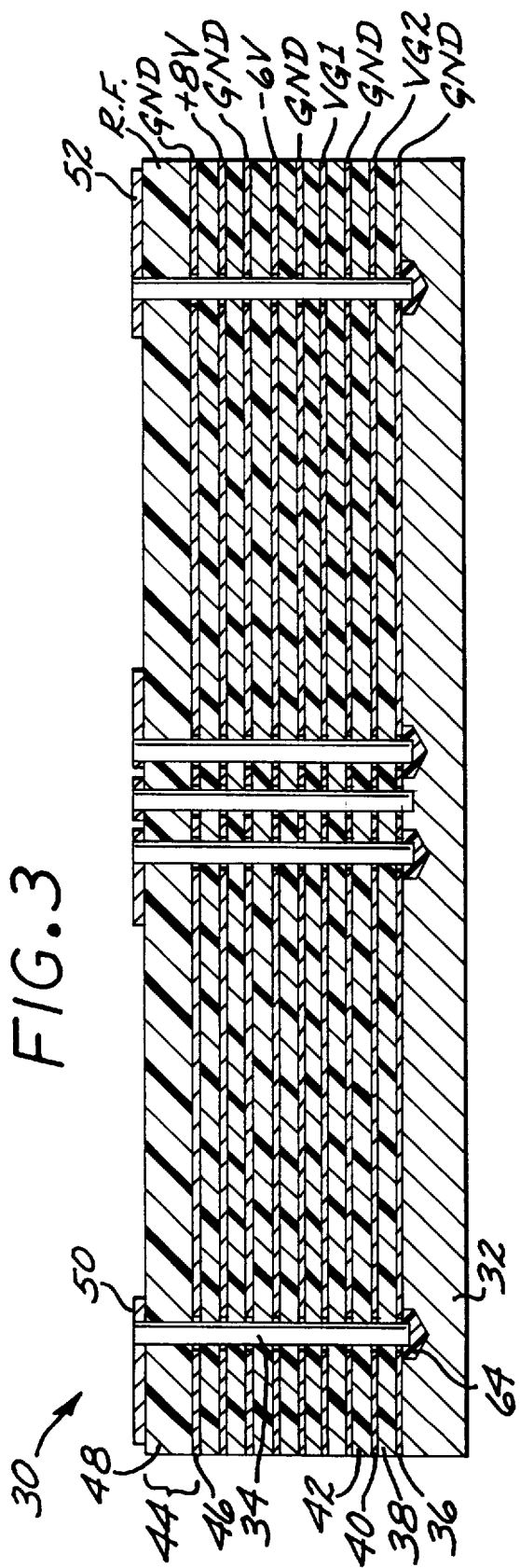
FIG. 3 is a schematic sectional view of the multilayer electrical distribution system of FIG. 2, taken along line 3—3.

FIG. 1 shows a basic structural configuration, but the approach of the invention is preferably used to fabricate more complex multilayer electronic structures. An example of such a complex structure, an electrical signal distribution system 30, is illustrated in FIGS. 2 and 3. The distribution system 30 permits multiple types of signals to be distributed to various locations using a thin, planar structure of high reliability, while maintaining electrical isolation and shielding of the signals of each type. The multilayer distribution system 30 includes a planar substrate 32, made of a material such as a piece of aluminum. At least one, and typically a plurality of, electrical interconnects 34 extend through the structure generally perpendicular to the plane of the substrate 32. The electrical interconnects 34 are preferably plated through holes extending through the thickness of the structure. Solid pins may be used rather than the plated interconnects.

A plurality of layers overlie the substrate 32. A first layer 36 is an electrically conducting metallic layer, a second layer 38 is an electrically nonconducting ceramic/polymer composite layer, a third layer 40 is an electrically conducting metallic layer, a fourth layer 42 is an electrically nonconducting ceramic/polymer composite layer, and so on in alternating fashion between electrically conducting metallic layers and electrically nonconducting ceramic/polymer composite layers. (A similar alternating pattern can be supplied on the back side of the substrate 32.) Each layer overlies, contacts, and is bonded to the adjacent layers. The metallic layers can be of the same metal or of different metals, such as the metals described previously for the layered electronic structure 20. The ceramic/polymer composite layers can be of the same material or of different materials, and of the same proportions or different proportions of the constituents, but are within the description of the ceramic/polymer composite layer described previously for the layered electronic structure 20. The thicknesses of the layers are selectable without limitation, but are typically in the range of from about 0.003 inch to about 0.007 inch A top structure 44 overlies the uppermost of the layers of metal and ceramic/polymer composite, here indicated as a layer 46. The top structure 44 typically includes a ceramic top plate 48 which, in cooperation with the substrate 32, sandwiches the layers 36, 38, 40, 42, and 46 to isolate them and create a monolithic structure. (In some cases, the top plate 48 can be a metal, but in those cases another insulator layer is typically provided overlying the top plate.) The plated interconnects 34 penetrate through the top plate 48 in most cases. External contacts 50 are typically co-deposited with or fastened to the portions of the plated interconnects 34 that protrude through the top plate 48. An additional metallic layer 52 can also lie on the top of the top plate 48.

The number of layers in the distribution system 30 is selected according to the distribution requirements in an application. The notations on the righthand side of FIG. 3 illustrate one approach of interest, by way of illustrating a preferred embodiment. Alternating metallic layers are used to carry voltages and signals, such as indicated by the notations VG2, VG1, −6V, and −8V. These signals can be AC or DC signals. These voltage- and signal-carrying layers are typically patterned to define conducting paths between external contacts.

Between the planes of the voltage- and signal-carrying layers are metallic ground plane layers marked GND. The ground plane layers provide signal isolation of the voltage- and signal-carrying layers, so that there is no induced interference resulting from the voltages and signals in the different layers. Insulating layers of the ceramic/polymer composite material are positioned between each of the metallic layers to prevent electrical contact between the metallic layers. The layer 52 is desirably used to conduct microwave or other radio frequency energy, if required in the distribution system, as the high-frequency signals travel at the unconstrained periphery of the layer.

Figure 4:
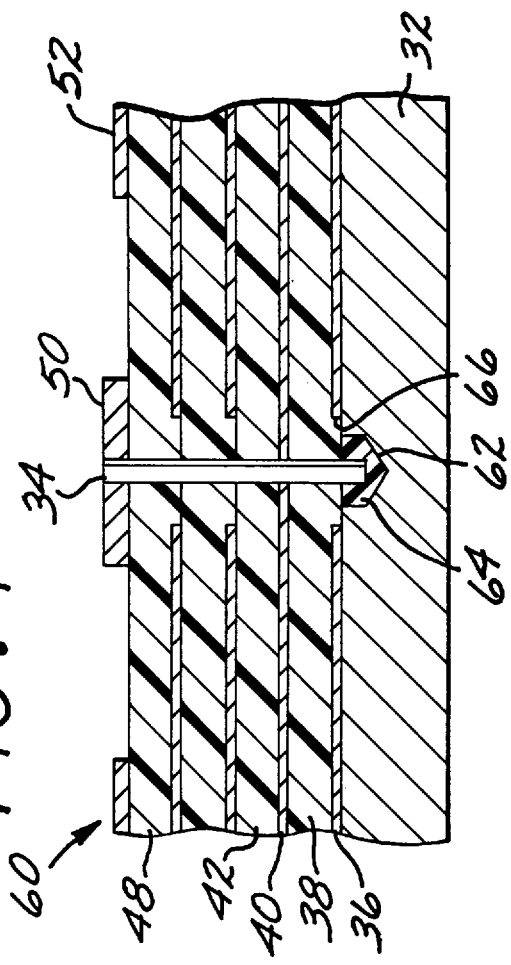
FIG. 4 is a schematic sectional view of a multilayer structure illustrating one form of the interconnect.

It is typically necessary to form external interconnects to the various metallic layers, and in some cases it is necessary to form internal, interlayer interconnects between buried metallic layers in the multilayer structure. FIG. 4 depicts one approach using plated through-holes as the electrical interconnect 34.

FIG. 4 illustrates the structure and functioning of the plated interconnect 34 as an electrical interconnect in relation to the other elements of a layered electronic structure 60. Here, by way of example, the electrical interconnect is formed between the contact 50 and a buried third layer 40. The structure 60 is intended to show the use of the interconnect generically, and is not intended to represent any particular structure such as the layered electronic structure 20 (which has fewer layers) or the distribution system 30 (which has more layers). Elements of the structure 60 which correspond to those of FIGS. 1–3 are correspondingly numbered.

The electrical interconnect 34 is set into a recess 62 and insulated from the substrate 32 by a small quantity of an insulator 64. The insulator 64 is desirably the same material as used for the ceramic/polymer composite. The electrically conducting first layer 36 has a clearance gap 66 between the metal of the first layer 36 and the electrical interconnect 34. The ceramic/polymer composite second layer 38 is deposited over the metallic first layer 36. The electrically nonconducting second layer 38 and the substrate 32 encapsulate the first layer 36 to isolate it against physical shorting. The second layer 38 extends to the electrical interconnect 34 and serves to electrically insulate the electrical interconnect 34.

The metallic third layer 40 overlies the ceramic/polymer second layer 38. In the illustrated case, the third layer 40 contacts and is bonded to the electrical interconnect 34, thereby establishing an electrical connection between the third layer 40 and the electrical interconnect 34. The ceramic/polymer fourth layer 42 is deposited over the third layer 40, contacting the electrical interconnect 34 to electrically insulate it.

Additional metallic and nonmetallic layers are deposited in the structure as needed. In the depicted structure 60, none of the other buried metallic layers within the structure contact the electrical interconnect 34. However, optionally such multiple connections to the electrical interconnect 34 could be made.

The top of the electrical interconnect 34 extends beyond the top of the top plate 48. The external contact 50 is affixed to the top of the electrical interconnect 34. The external contact 50 can be a thin plate or contact or the like, or it can be a thick interconnect layer deposited overlying the electrical interconnect 34.

FIG. 4 also shows the metallic layer 52 which, in a preferred embodiment, is used to carry microwave signals.

The use of the various electrical interconnects 34 to provide external interconnections to the various buried electrically conducting layers can be seen by reference to FIGS. 2 and 3. The contacts 50 on the top of the distribution system 30 (FIG. 2) are labelled with the same notation as found on the righthand side of FIG. 3, to indicate which external voltage or signal is connected through the respective contacts. The connections are made with the appropriate voltage- or signal-carrying layer using the approach shown in FIG. 4, by selecting the layer (corresponding to layer 40 of FIG. 4) which is electrically connected to the electrical interconnect. In some cases of interest, all of the ground planes can be commonly connected through a single interconnect, but in other cases each ground plane may require its own separate interconnect. Multiple external interconnections to a single metallic layer can also be provided, as illustrated, by providing electrical communication of a single layer to multiple connectors.

Figure 5:
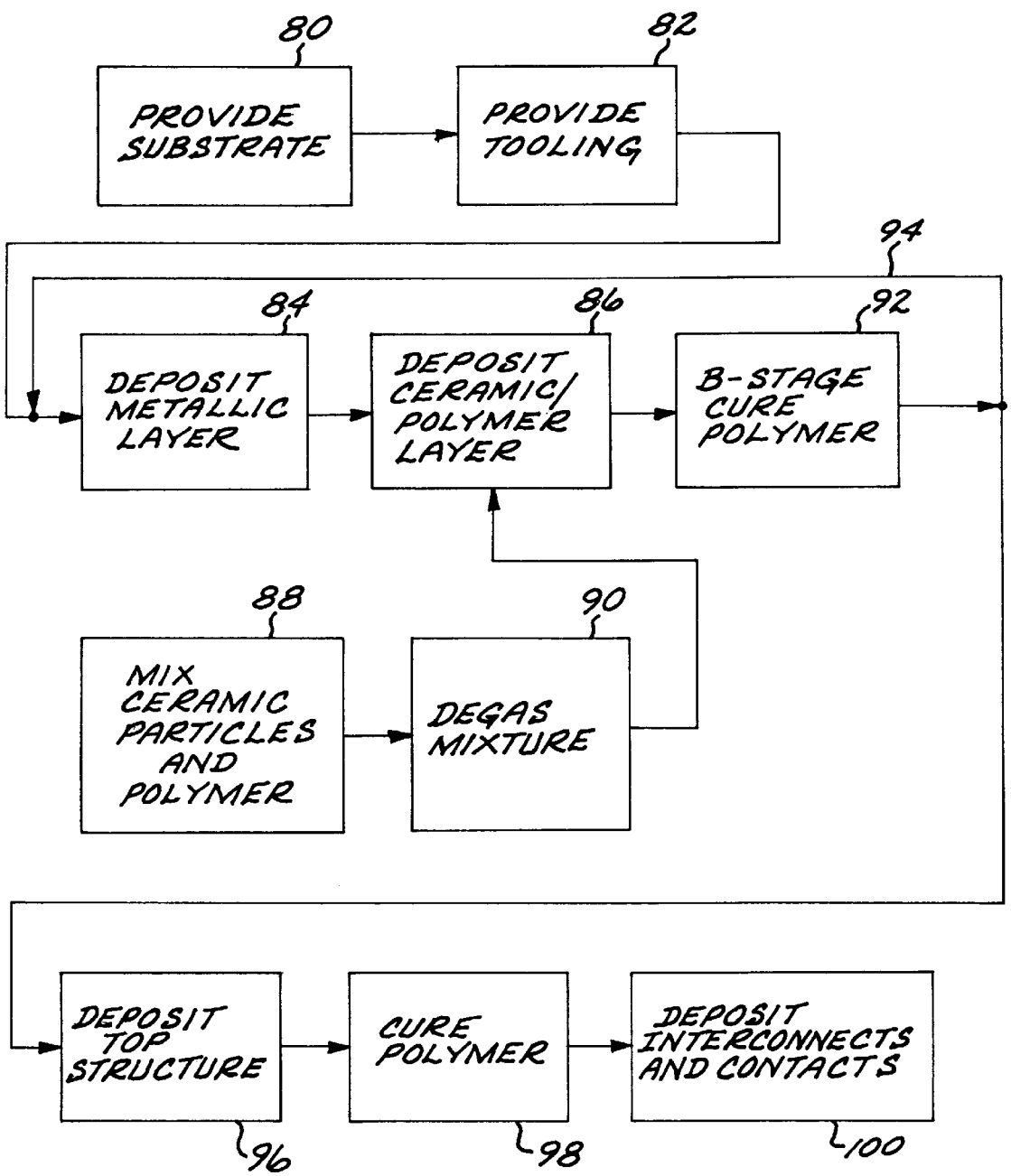
FIG. 5 is a block flow diagram of a method for fabricating a layered electronic structure.

FIG. 5 depicts a preferred method for practicing the approach of the invention in the case of structures such as the distribution system 30 or the structure 60, when electrical interconnects 34 are used. The approach can be modified as necessary for other structures. The substrate 32 of the desired material and required size is provided, numeral 80. Tooling is ordinarily provided, numeral 82, to ensure proper positioning of the substrate and subsequently deposited or positioned elements.

The first metallic layer 36 is deposited onto the substrate 32, numeral 84. Deposition of the metal is accomplished by any operable technique. The preferred technique is to provide a thin piece of metal of the required thickness, pattern and etch it by conventional patterning and etching techniques, and place the patterned metal piece into place using projections on the tooling as positioning aids. Equivalently for the present purposes, vapor deposition or silk screening of a metal-containing slurry may be used. In either case, the pattern of the metallic layer defines any conductor trace pattern that is required for that layer and also defines the clearance gaps and regions of electrical interconnection, if any. Each of the deposited metallic layers described in this fabrication sequence can be provided with any necessary pattern or structure to fulfill its electrical requirements.

The ceramic/polymer second layer 38 is deposited overlying the first layer, numeral 86. At the time of deposition, the material of the ceramic-polymer layer 38 is a flowable slurried mixture of ceramic particles and an uncured polymer precursor. The mixture is prepared by mixing the ceramic particles and the polymer material together, numeral 88. A mixture of ceramic particles and polymer material is used so that the electrical properties of the mixture can be tailored for specific applications. The greater the fraction of ceramic particles in the mixture, the higher the dielectric constant of the mixture, for example.

The ceramic particles are made of a ceramic material such as, for example, barium titanate, titanium dioxide, ferrite, aluminum oxide, steatite, forsterite, or cordierite. The ceramic particles must be smaller in diameter than the thickness of the layer in which they are to be used, and the amount of ceramic particles must not be so large that the viscosity of the mixture is too great to flow during the deposition process. In the preferred approach, the ceramic particles comprise from about 20 to about 75 percent by weight of the mixture of ceramic particles and polymer precursor, to produce the desired consistence of the particle-polymer mixture and yield the desired electrical properties in the final product.

The polymer precursor is of a polymer having a low dielectric constant and microwave loss, and forms the remainder of the mixture of ceramic particles and polymer precursor. The preferred polymer precursor is a difunctional bisphenol/epichlorohydrin-derived epoxy or a polyimide, with its appropriate curing agent.

In accomplishing the mixing 88, weighed quantities of the ceramic particles and resin polymer precursor (including its recommended curing agent, if any) are thoroughly hand mixed followed by 3–5 minutes of ultrasonic mixing. When a flowable resin polymer precursor is exposed to a progressively higher ultrasonic power, small bubbles can be formed. These bubbles or cavities can have a strong influence on the neighboring particles. To minimize the incidence of such bubbles, care is taken to maintain the ultrasonic power during mixing at a level below that at which large numbers of the bubbles form. In practice, the permitted power level depends on the batch size. For a preferred 100-gram batch of the ceramic/polymer precursor material, 3 minutes of mixing in a standard laboratory Branson ultrasonic mixer was found to be sufficient.

After mixing is complete, the mixture is allowed to stand for about 3 minutes to permit further chemical cross-linking reaction between the polymer precursor and the curing agent. This reaction produces bubbles within the mixture.

Bubbles produced by mixing and/or the cross-linking reaction are reduced or removed by vacuum degassing, numeral 90. The vacuum degassing is preferably performed in a standard bell jar under a vacuum of 30 inches of mercury for about 15–30 minutes. At this stage, the mixture of ceramic particles and partially cross linked polymer material is a highly viscous paste having the consistency of honey.

The mixture of ceramic particles and polymer precursor is deposited onto the surface to be coated with a thin layer, numeral 86. The mixture flows at ambient temperature. Deposition is by any operable approach, but preferably is accomplished by silk screening. The thickness of the ceramic particle-polymer precursor layer can be varied as desired for a specific application. Thicker layers are typically used for layered structures in which metallic layers carrying high voltages must be separated, and thinner layers are used for other applications. By way of illustration and not limitation, the ceramic/polymer layer, after curing, is typically from about 0.003 to about 0.007 inches thick. A virtue of the present approach is that the thickness of the ceramic/polymer composite layers can be controlled by varying the thickness of the as-deposited layer After a layer of the ceramic/polymer mixture is deposited, it optionally may be partially cured, numeral 92, with or without an applied external pressure, to a temperature appropriate to achieve partial, or "B-stage" curing of the polymer. For the preferred polymer precursors, B-stage curing is achieved by heating to a temperature of about 95° C. for a time of about 6 minutes. However, in many cases B-staging the polymer is not necessary, and the entire structure can be built up with uncured polymer. If the latter approach is taken, it is preferred to leave a large border containing no electrical circuitry around the edges of the electrical circuit, so that any loss of ceramic/polymer from the edges of the uncured structure does not affect the final electrical structure. The latter approach is preferred, as the avoidance of the B-stage curing operation reduces processing costs.

The steps 84, 86, and 92 are repeated as often as necessary and as indicated by the path designated by numeral 94, to build up alternating metallic and ceramic/polymer composite layers. The metals, metallic layer patterning, ceramic/polymer composite, layer thicknesses, and other parameters need not be the same for each repetition, but can be varied as dictated by the application of the structure being fabricated.

After the required metallic and ceramic/polymer layers are built up, the top structure 44 is applied, numeral 96. The top plate 48 is deposited in any operable manner, such as the same manner as the ceramic/polymer composite layers or as a separate piece of material. The metallic layer 52 is applied in any operable manner, preferably as a patterned metallic piece, vapor deposition, or silk screening a metallic slurry.

The polymer of the ceramic/polymer layers (either B-staged or uncured) is fully cured by heating the structure, optionally with application of an external pressure perpendicular to the layers of ceramic/polymer composite and metal to aid in their bonding, to a temperature and for a time sufficient to fully cure the polymer. The curing is accomplished according to the requirements for the selected polymer, but typically is on the order of about 150° C. to 180° C. for a time of about ½ to 1 hour.

The electrical interconnects 34 and contacts 50 are formed, numeral 100. In the preferred approach, dummy pins are provided in the tooling to define the locations of the through-thickness electrical interconnects. The tooling is removed, leaving through-thickness holes at the required locations. The partially completed structure is placed into an electroplating apparatus and the electrical interconnects 34 are plated of a conductive metal such as copper or aluminum. In the preferred approach, the electrical contacts 50 are deposited by plating at the same time, in contact with the electrical interconnects 34. In the alternative approach where pins are used instead of the plated through-hole electrical interconnects 34, the pins are set into the substrate prior to step 84.

The structure resulting from the processing of FIG. 5 is compact, light in weight, rugged, reliable, and capable of carrying a wide variety of electrical signals without mutual interference. Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A layered electronic structure, comprising:
    a substrate;
    a first layer of a first-layer metal overlying the substrate;
    a second layer of a second-layer mixture of second-layer ceramic particles and a second-layer cured polymer, the second layer overlying, contacting, and bonded to the first layer;
    a third layer of a third-layer metal, the third layer overlying, contacting, and bonded to the second layer; and
    a fourth layer of a fourth-layer mixture of fourth-layer ceramic particles and a fourth-layer cured polymer, the fourth layer overlying, contacting, and bonded to the third layer a metallic interconnect comprising a vertical conductive column in electrical communication one of the first layer and the third layer.

2. The layered electronic structure of claim 1, wherein the first-layer metal is selected from the group consisting of copper and aluminum.

3. The layered electronic structure of claim 1, wherein the ceramic particles in the second and fourth layer have a dielectric constant of from about 3 to about 98.

4. The layered electronic structure of claim 1, wherein the second and the fourth layer ceramic particles are selected from the group consisting of barium titanate, titanium dioxide, ferrite, aluminum oxide, steatite, forsterite, and cordierite.

5. The layered electronic structure of claim 1, wherein the second and the fourth layer cured polymer are selected from the group consisting of a difunctional bisphenol/epichlorohydrin-derived epoxy and a polyimide.

6. The layered electronic structure of claim 1, wherein the second layer has a thickness of from about 0.003 inches to about 0.007 inches.

7. The layered electronic structure of claim 1, wherein the ceramic particles in the second and fourth layer have a maximum dimension of about 5 micrometers.

8. The layered electronic structure of claim 1, wherein the ceramic particles in the second and fourth layer comprise from about 20 to about 75 percent by volume of the second layer.

9. The layered electronic structure of claim 1, wherein the metallic interconnect comprises:
    a third-layer metallic interconnect comprising a vertical conductive column in electrical communication with the third layer and extending through the fourth layer.

10. The layered electronic structure of claim 1, wherein the metallic interconnect comprises:
a first-layer metallic interconnect comprising a vertical conductive column in electrical communication with the first layer and extending through the second layer and the fourth layer, but not in electrical communication with the third layer.

11. The layered electronic structure of claim 1, wherein each of the first layer and the third layer is patterned to define conducting paths thereon.

12. A layered electronic structure, comprising:
a substrate;
a first layer of a first-layer metal overlying, contacting, and bonded to the substrate;
a second layer of a second-layer mixture of second-layer ceramic particles and a second-layer cured polymer, wherein the second-layer ceramic particles comprise from about 20 to about 75 percent by volume of the second layer, the second layer overlying, contacting, and bonded to the first layer;
a third layer of a third-layer metal, the third layer overlying, contacting, and bonded to the second layer, wherein one of the first layer and the third layer is patterned to define conducting paths thereon and the other of the first layer and the third layer is at ground potential;
a fourth layer of a fourth-layer mixture of fourth-layer ceramic particles and a fourth-layer cured polymer, wherein the fourth-layer ceramic particles comprise from about 20 to about 75 percent by volume of the fourth layer, the fourth layer overlying, contacting, and bonded to the third layer;
a first-layer electrical contact comprising a vertical conductive column in electrical communication with the first layer and extending through the second layer, the third layer, and the fourth layer, but not in electrical communication with the third layer; and
a third-layer electrical in electrical communication with the third layer and extending through the fourth layer.

* * * * *